US012580029B2

(12) United States Patent
Thoppa et al.

(10) Patent No.: US 12,580,029 B2
(45) Date of Patent: Mar. 17, 2026

(54) NEIGHBOR PLANE DISTURB (NPD) DETECTION FOR MEMORY DEVICES

(71) Applicant: Sandisk Technologies, Inc., Milpitas, CA (US)

(72) Inventors: Sai Gautham Thoppa, San Jose, CA (US); Parth Amin, Fremont, CA (US); Long Pham, San Ramon, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 171 days.

(21) Appl. No.: 18/369,296

(22) Filed: Sep. 18, 2023

(65) Prior Publication Data

US 2025/0095757 A1     Mar. 20, 2025

(51) Int. Cl.
| | |
|---|---|
| *G11C 16/34* | (2006.01) |
| *G11C 16/08* | (2006.01) |
| *G11C 16/10* | (2006.01) |

(52) U.S. Cl.
CPC .......... *G11C 16/3427* (2013.01); *G11C 16/08* (2013.01); *G11C 16/102* (2013.01)

(58) Field of Classification Search
CPC ... G11C 16/3427; G11C 16/08; G11C 16/102; G11C 16/0483; G11C 16/10; G11C 16/3459
See application file for complete search history.

(56) References Cited

U.S. PATENT DOCUMENTS

2022/0415421 A1 * 12/2022 Tian ................... G11C 16/3459

* cited by examiner

*Primary Examiner* — Jay W. Radke
(74) *Attorney, Agent, or Firm* — Dickinson Wright PLLC

(57) ABSTRACT

A memory device includes a plurality of memory cells arranged in a plurality of planes and control circuitry configured to perform a multi-plane programming operation in which memory cells in each of the plurality of planes are programmed in a single programming operation. To perform the multi-plane programming operation, the control circuitry is configured to detect a neighbor plane disturb (NPD) defect during the multi-plane programming operation, in response to detecting the NPD defect, terminate the multi-plane programming operation prior to completing the multi-plane programming operation, and identify which plane of the plurality of planes includes the NPD defect.

17 Claims, 14 Drawing Sheets

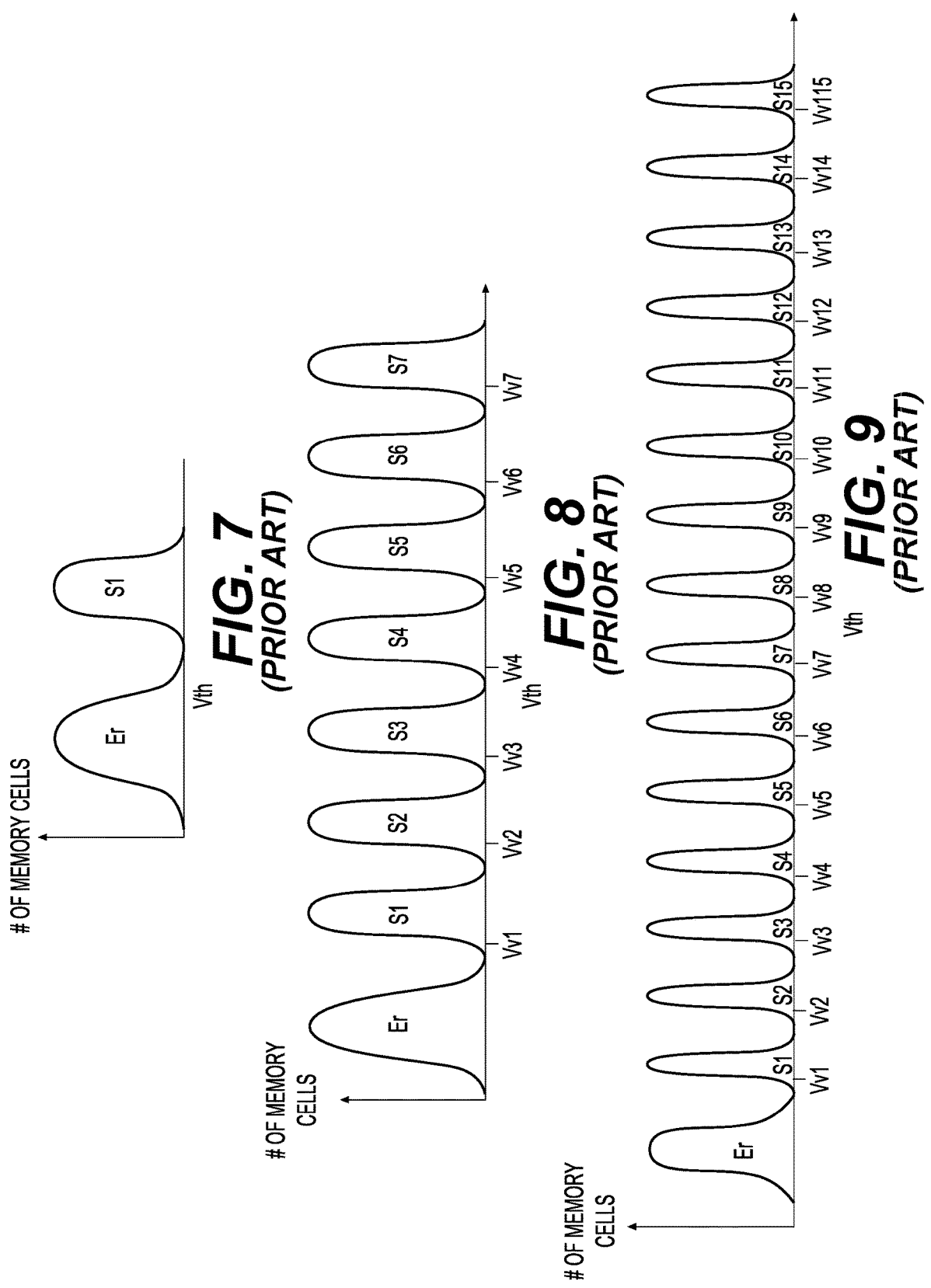

NEIGHBOR PLANE DISTURB (NPD) DETECTION FOR MEMORY DEVICES

BACKGROUND

1. Field

The present disclosure is related generally to techniques for detecting neighbor plane disturb (NPD) in memory devices.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery. As one example, a NAND memory device includes a chip with a plurality of memory blocks, each of which includes an array of memory cells arranged in a plurality of word lines.

Memory systems can be used to store data provided by a host device (or other client). However, various challenges are presented in operating such memory systems. In particular, memory cells of the memory system may be arranged in multiple planes connected to the same word lines and programmed concurrently. However, certain word line defects on one plane may disturb programming of memory cells on the concurrently programmed planes and may lead to overprogramming. Thus, there is a need for improved memory apparatuses and methods of operation that overcome such challenges.

SUMMARY

This section provides a general summary of the present disclosure and is not a comprehensive disclosure of its full scope or all of its features and advantages.

A memory device includes a plurality of memory cells arranged in a plurality of planes and control circuitry configured to perform a multi-plane programming operation in which memory cells in each of the plurality of planes are programmed in a single programming operation. To perform the multi-plane programming operation, the control circuity is configured to detect a neighbor plane disturb (NPD) defect during the multi-plane programming operation, in response to detecting the NPD defect, terminate the multi-plane programming operation prior to completing the multi-plane programming operation, and identify which plane of the plurality of planes includes the NPD defect.

In other features, the control circuitry is configured to detect the NPD defect based on a program voltage applied to a word line of the memory device. The control circuitry is configured to detect the NPD defect based on a determination of whether the program voltage reaches a target voltage level within a predetermined period. The word line corresponds to a word line coupled to the memory cells in each of the plurality of planes. In response to detecting the NPD defect, the control circuitry is configured terminate the multi-plane programming operation prior to completing a maximum number of programming loops associated with the multi-plane programming operation. To identify which plane of the plurality of planes includes the NPD defect, the control circuitry is configured to transition from a multi-plane programming mode to a single plane programming mode and sequentially perform single plane programming operations on each of the plurality of planes. During the single plane programming operations, the control circuitry is configured to identify whether a selected plane has the NPD defect based on a program voltage applied to a word line of the memory device.

A method for operating a memory device including a plurality of memory cells arranged in a plurality of planes includes performing a multi-plane programming operation in which memory cells in each of the plurality of planes are programmed in a single programming operation. Performing the multi-plane programming operation includes detecting a neighbor plane disturb (NPD) defect during the multi-plane programming operation, in response to detecting the NPD defect, terminating the multi-plane programming operation prior to completing the multi-plane programming operation, and identifying which plane of the plurality of planes includes the NPD defect.

In other features, the method further includes detecting the NPD defect based on a program voltage applied to a word line of the memory device. The method further includes detecting the NPD defect based on a determination of whether the program voltage reaches a target voltage level within a predetermined period. The word line corresponds to a word line coupled to the memory cells in each of the plurality of planes. The method further includes, in response to detecting the NPD defect, terminating the multi-plane programming operation prior to completing a maximum number of programming loops associated with the multi-plane programming operation. Identifying which plane of the plurality of planes includes the NPD defect includes transitioning from a multi-plane programming mode to a single plane programming mode and sequentially performing single plane programming operations on each of the plurality of planes. The method further includes, during the single plane programming operations, identifying whether a selected plane has the NPD defect based on a program voltage applied to a word line of the memory device.

A memory device includes a plurality of memory cells arranged in a plurality of planes and control means for performing a multi-plane programming operation in which memory cells in each of the plurality of planes are programmed in a single programming operation. To perform the multi-plane programming operation, the control means detects a neighbor plane disturb (NPD) defect during the multi-plane programming operation, in response to detecting the NPD defect, terminates the multi-plane programming operation prior to completing the multi-plane programming operation, and identifies which plane of the plurality of planes includes the NPD defect.

In other features, the control means detects the NPD defect based on whether a program voltage applied to a word line of the memory device reaches a target voltage level within a predetermined period. The word line corresponds to a word line coupled to the memory cells in each of the plurality of planes. In response to detecting the NPD defect, the control means terminates the multi-plane programming operation prior to completing a maximum number of programming loops associated with the multi-plane programming operation. To identify which plane of the plurality of planes includes the NPD defect, the control means transitions from a multi-plane programming mode to a single plane programming mode and sequentially performs single plane programming operations on each of the plurality of planes. During the single plane programming operations, the control means identifies whether a selected plane has the NPD defect based on a program voltage applied to a word line of the memory device.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and other features and advantages of the present disclosure will become more readily appreciated when considered in connection with the following description of the presently preferred embodiments, appended claims and accompanying drawings, in which:

FIG. 7 depicts a threshold voltage distribution of a page of memory cells programmed to one bit per memory cell (SLC);

FIG. 8 depicts a threshold voltage distribution of a page of memory cells programmed to three bits per memory cell (TLC);

FIG. 9 depicts a threshold voltage distribution of a page of memory cells programmed to four bits per memory cell (QLC);

Figure 1:
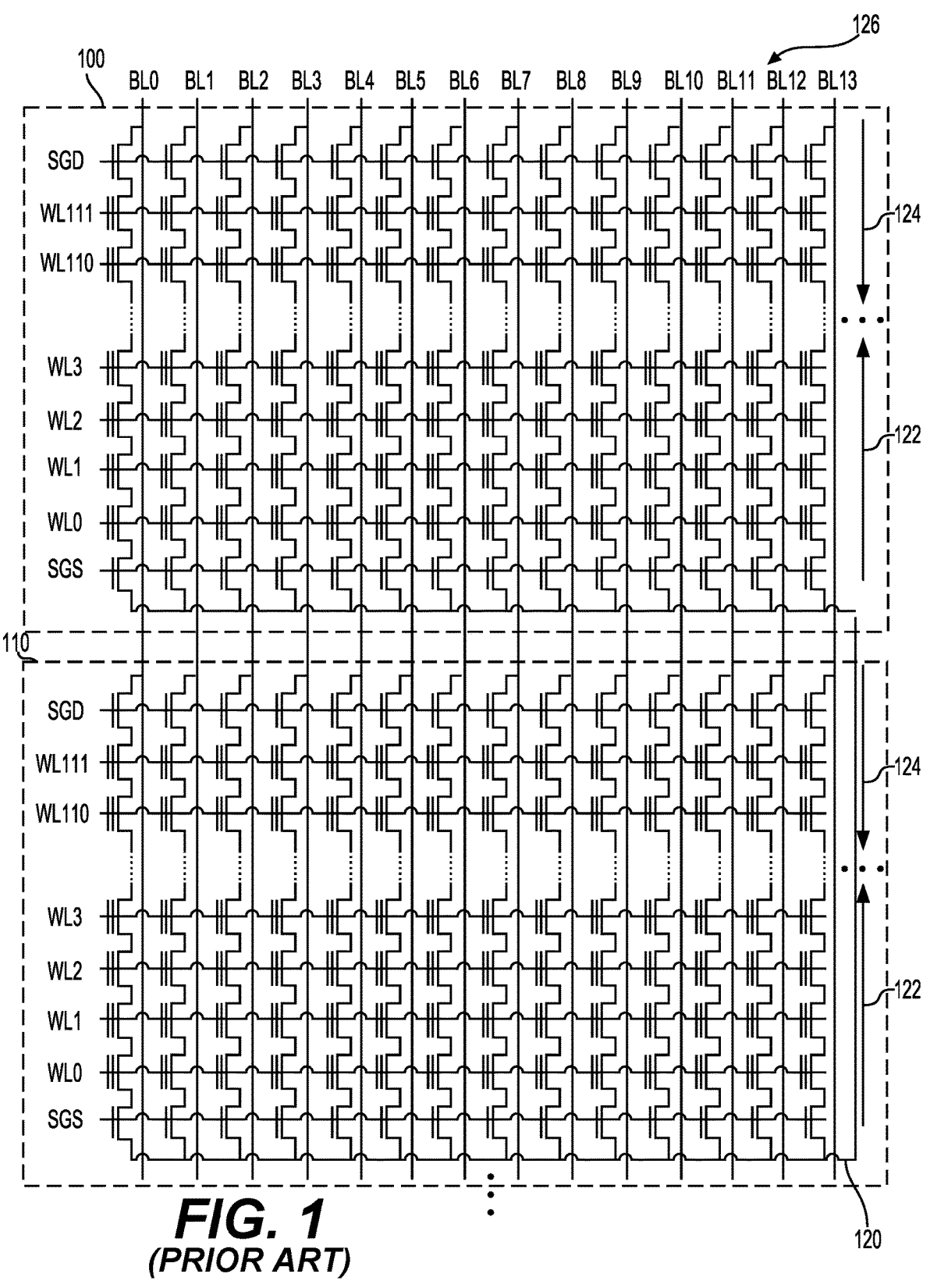
FIG. 1 depicts blocks of memory cells in an example two-dimensional configuration of a memory array.

DESCRIPTION OF THE ENABLING
EMBODIMENT

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

For example, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines (e.g., blocks in different planes connected to same word lines) may be programmed concurrently. Although multi-plane programming may increase programming speed, any defects such as the word line defects described above on one plane may disturb programming of memory cells on the concurrently programmed planes. One type of defect may be referred to as "neighbor plane disturb" (NPD), which occurs when programming memory cells of one plane causes a small amount of charge to leak to memory cells of neighboring planes, which may unintentionally change states of the memory cells in the neighboring planes.

Systems and methods according to the present disclosure are configured to detect NPD defects or failures during multi-plane programming operations.

A pair of example memory blocks 100, 110 are illustrated in a FIG. 1. The memory blocks 100, 110 may be implemented in a system comprising a controller or control circuitry configured to implement NPD detection techniques according to the present disclosure. In this example, the memory blocks 100, 110 have a two-dimensional configuration. A memory array in the chip can include many such blocks 100, 110. Each example block 100, 110 includes a number of NAND strings and respective bit lines, e.g., BL0, BL1, . . . which are shared among the blocks. Each NAND string is connected at one end to a drain-side select gate (SGD), and the control gates of the drain select gates are connected, in some examples, via a common SGD line. The NAND strings are connected at their other end to a source-side select gate (SGS) which, in turn, is connected to a common source line 120. One hundred and twelve word lines (WL0-WL111), for example, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 2A:
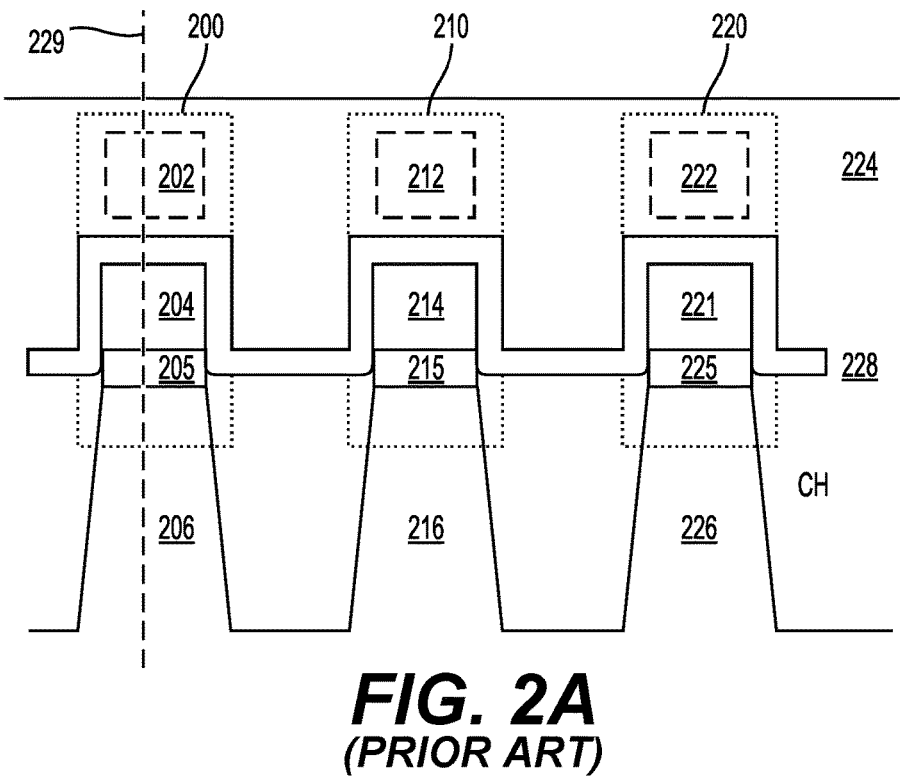
FIG. 2A and FIG. 2B depict cross-sectional views of example floating gate memory cells in NAND strings.
Figure 2B:
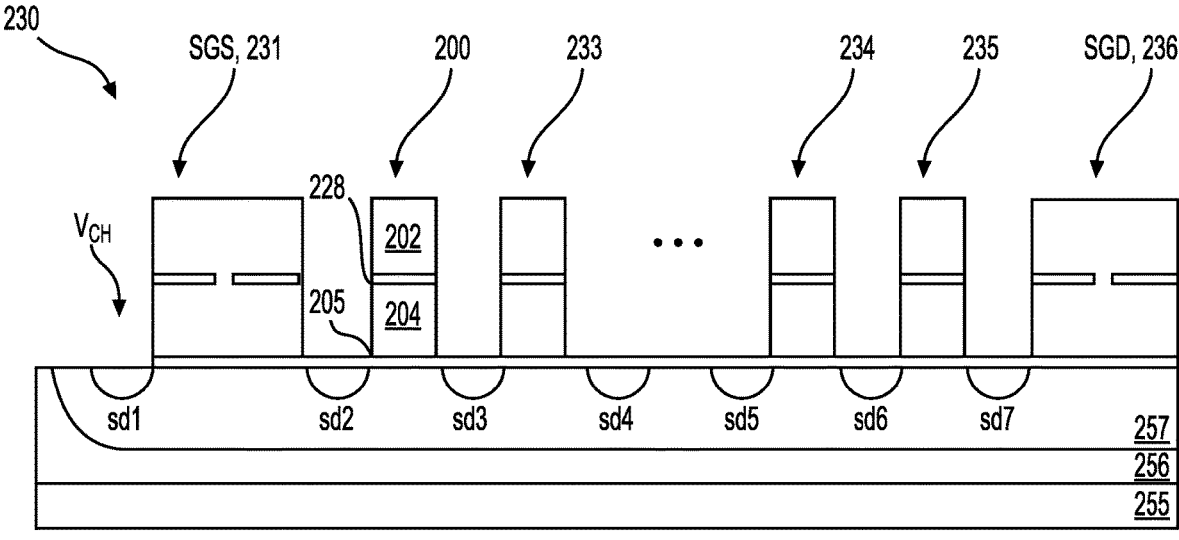

One type of non-volatile memory which may be provided in the memory array is a floating gate memory, such as of the type shown in FIGS. 2A and 2B. However, other types of non-volatile memory can also be used. As discussed in further detail below, in another example shown in FIGS. 3A and 3B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the cell channel into the nitride, where they are trapped and stored in a limited region. This stored charge then changes the threshold voltage Vt of a portion of the channel of the cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known.

FIG. 2A illustrates a cross-sectional view of example floating gate memory cells 200, 210, 220 in NAND strings. In this Figure, a bit line or NAND string direction goes into the page, and a word line direction goes from left to right. As an example, word line 224 extends across NAND strings which include respective channel regions 206, 216 and 226. The memory cell 200 includes a control gate 202, a floating gate 204, a tunnel oxide layer 205 and the channel region 206. The memory cell 210 includes a control gate 212, a floating gate 214, a tunnel oxide layer 215 and the channel region 216. The memory cell 220 includes a control gate 222, a floating gate 221, a tunnel oxide layer 225 and the channel region 226. Each memory cell 200, 210, 220 is in a different respective NAND string. An inter-poly dielectric (IPD) layer 228 is also illustrated. The control gates 202, 212, 222 are portions of the word line. A cross-sectional view along contact line connector 229 is provided in FIG. 2B.

The control gate 202, 212, 222 wraps around the floating gate 204, 214, 221, increasing the surface contact area between the control gate 202, 212, 222 and floating gate 204, 214, 221. This results in higher IPD capacitance, leading to a higher coupling ratio which makes programming and erase easier. However, as NAND memory devices are scaled down, the spacing between neighboring cells 200, 210, 220 becomes smaller so there is almost no space for the control gate 202, 212, 222 and the IPD layer 228 between two adjacent floating gates 202, 212, 222.

Figures 3A, 3B:
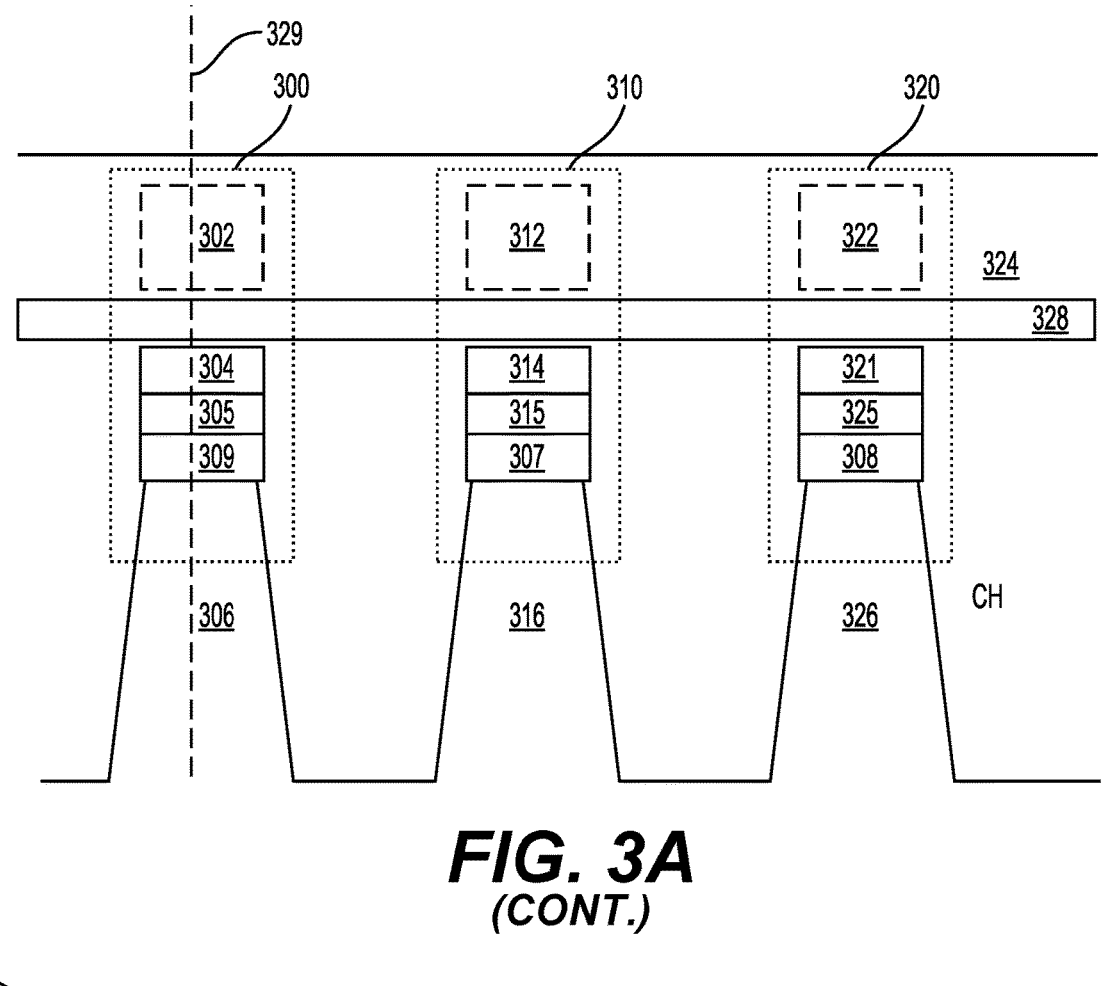
FIG. 3A and FIG. 3B depict cross-sectional views of example charge-trapping memory cells in NAND strings.

As an alternative, as shown in FIGS. 3A and 3B, the flat or planar memory cell 300, 310, 320 has been developed in which the control gate 302, 312, 322 is flat or planar; that is, it does not wrap around the floating gate and its only contact with the IPD layer 328 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3A depicts a cross-sectional view of example charge-trapping memory cells 300, 310, 320 in NAND strings. The view is in a word line direction of memory cells 300, 310, 320 comprising a flat control gate and charge-trapping regions as a two-dimensional example of memory cells 300, 310, 320 in the memory cell array 126. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 324 extends across NAND strings which include respective channel regions 306, 316, 326. Portions of the word line provide control gates 302, 312, 322. Below the word line is an IPD layer 328, charge-trapping layers 304, 314, 321, polysilicon layers 305, 315, 325, and tunneling layers 309, 307, 308. Each charge-trapping layer 304, 314, 321 extends continuously in a respective NAND string. The flat configuration of the control gate can be made thinner than a floating gate. Additionally, the memory cells can be placed closer together.

FIG. 3B illustrates a cross-sectional view of the structure of FIG. 3A along contact line connector 329. The NAND string 330 includes an SGS transistor 331, example memory cells 300, 333, . . . 335, and an SGD transistor 336. Passageways in the IPD layer 328 in the SGS and SGD transistors 331, 336 allow the control gate layers 302 and floating gate layers to communicate. The control gate 302 and floating gate layers may be polysilicon and the tunnel oxide layer may be silicon oxide, for instance. The IPD layer 328 can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

Figure 4:
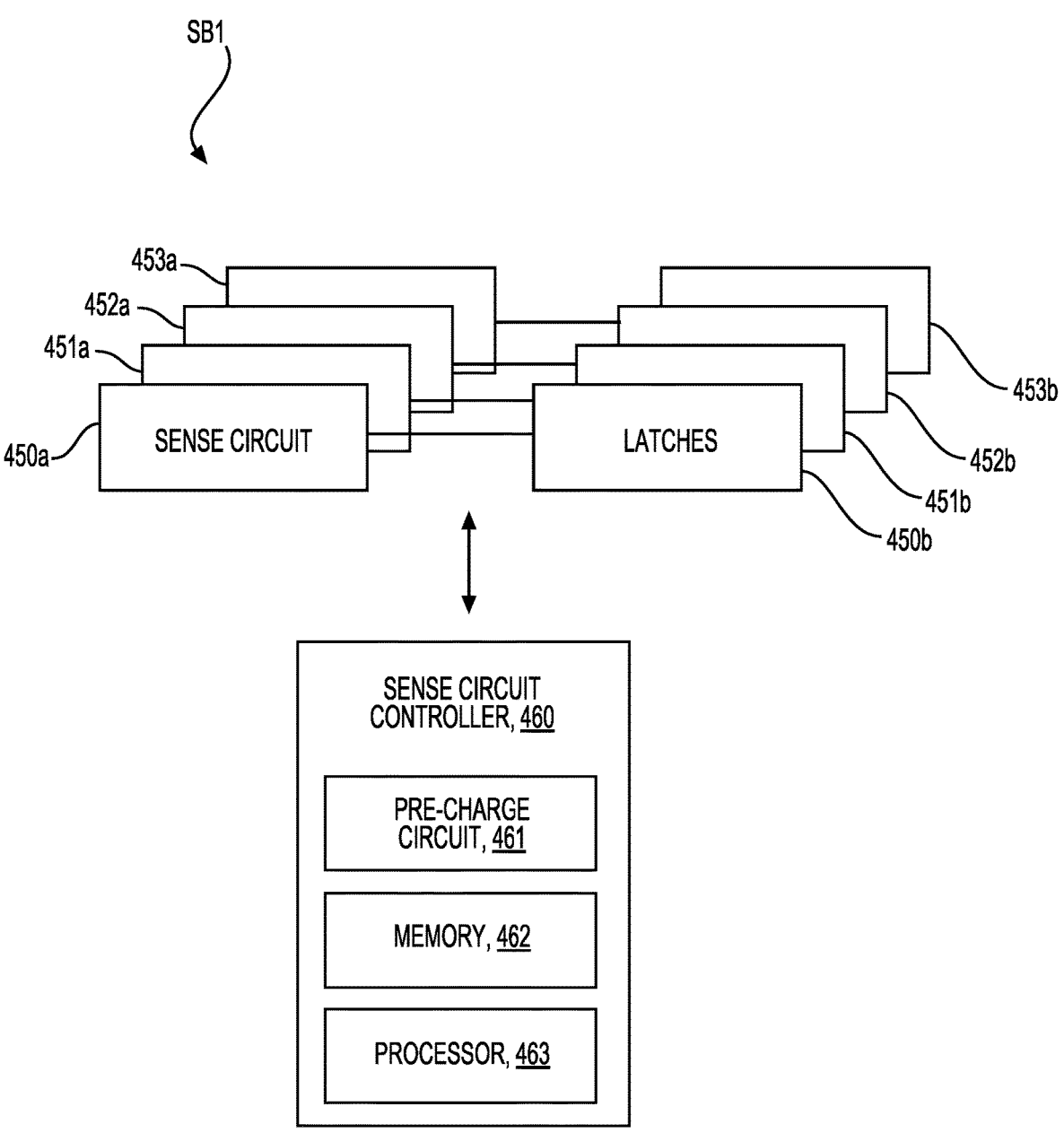
FIG. 4 depicts an example block diagram of a sense block SB1.

FIG. 4 illustrates an example block diagram of a sense block SB1 in a memory chip. In one approach, a sense block comprises multiple sense circuits. Each sense circuit is associated with data latches. For example, the example sense circuits 450*a*, 451*a*, 452*a*, and 453*a* are associated with the data latches 450*b*, 451*b*, 452*b*, and 453*b*, respectively. In one approach, different subsets of bit lines can be sensed using different respective sense blocks. This allows the processing load which is associated with the sense circuits to be divided up and handled by a respective processor in each sense block. For example, a sense circuit controller 460 in SB1 can communicate with the set of sense circuits and latches. The sense circuit controller 460 may include a pre-charge circuit 461 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 460 may also include a pre-charge circuit 461, a memory 462 and a processor 463. The memory 462 may store code which is executable by the processor to perform the functions described herein. These functions can include reading the latches 450*b*, 451*b*, 452*b*, 453*b* which are associated with the sense circuits 450*a*, 451*a*, 452*a*, 453*a*, setting bit values in the latches and providing voltages for setting pre-charge levels in sense nodes of the sense circuits 450*a*, 451*a*, 452*a*, 453*a*. Further example details of the sense circuit controller 460 and the sense circuits 450*a*, 451*a*, 452*a*, 453*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 5A:
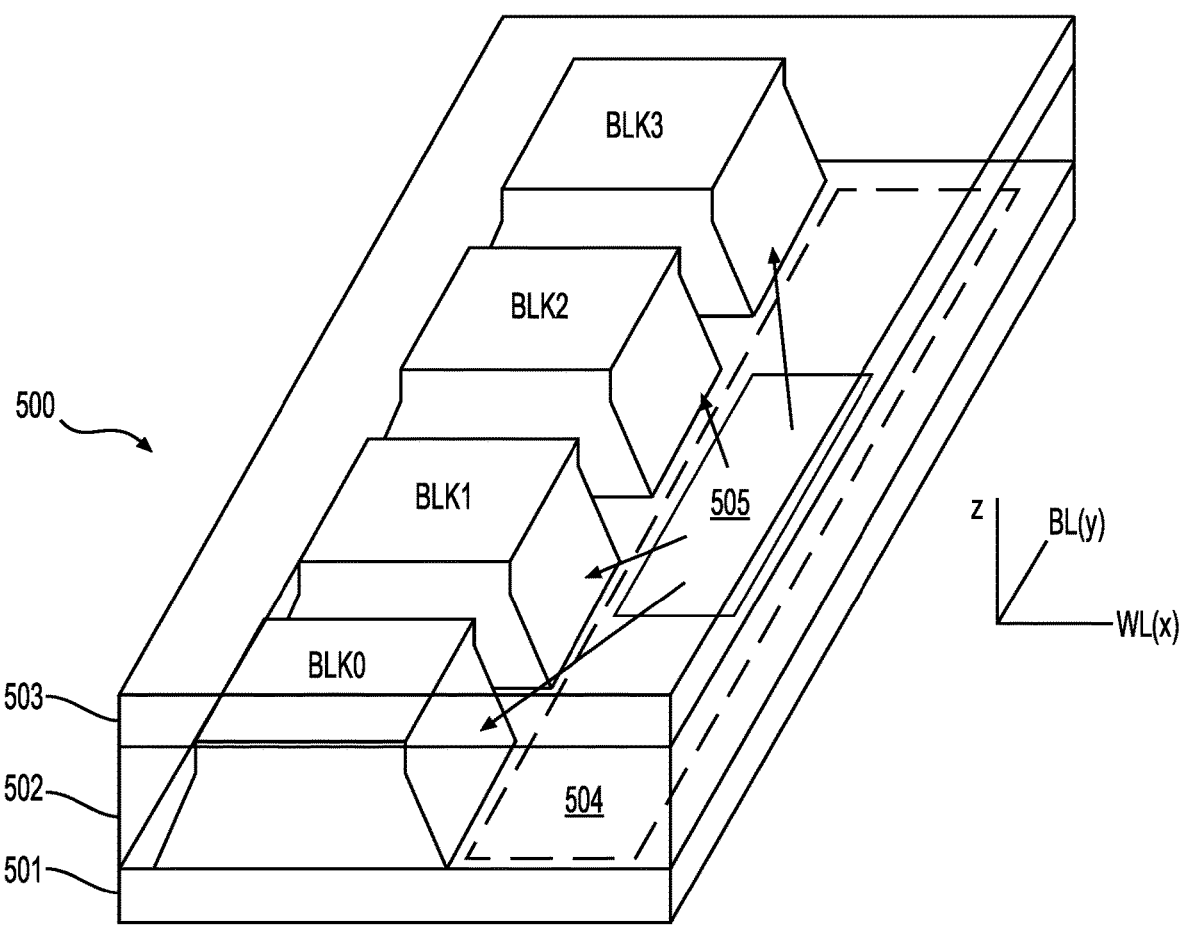
FIG. 5A is a perspective view of a set of blocks in an example three-dimensional configuration of a memory array.

FIG. 5A is a perspective view of a set of blocks 500 in an example three-dimensional configuration. On the substrate are example blocks BLK0, BLK1, BLK2, BLK3 of memory cells (storage elements) and a peripheral area 504 with circuitry for use by the blocks BLK0, BLK1, BLK2, BLK3. For example, the circuitry can include voltage drivers 505 which can be connected to control gate layers of the blocks BLK0, BLK1, BLK2, BLK3. In one approach, control gate layers at a common height in the blocks BLK0, BLK1, BLK2, BLK3 are commonly driven. The substrate 501 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 502 of the memory device. In an upper region 503 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 5B:
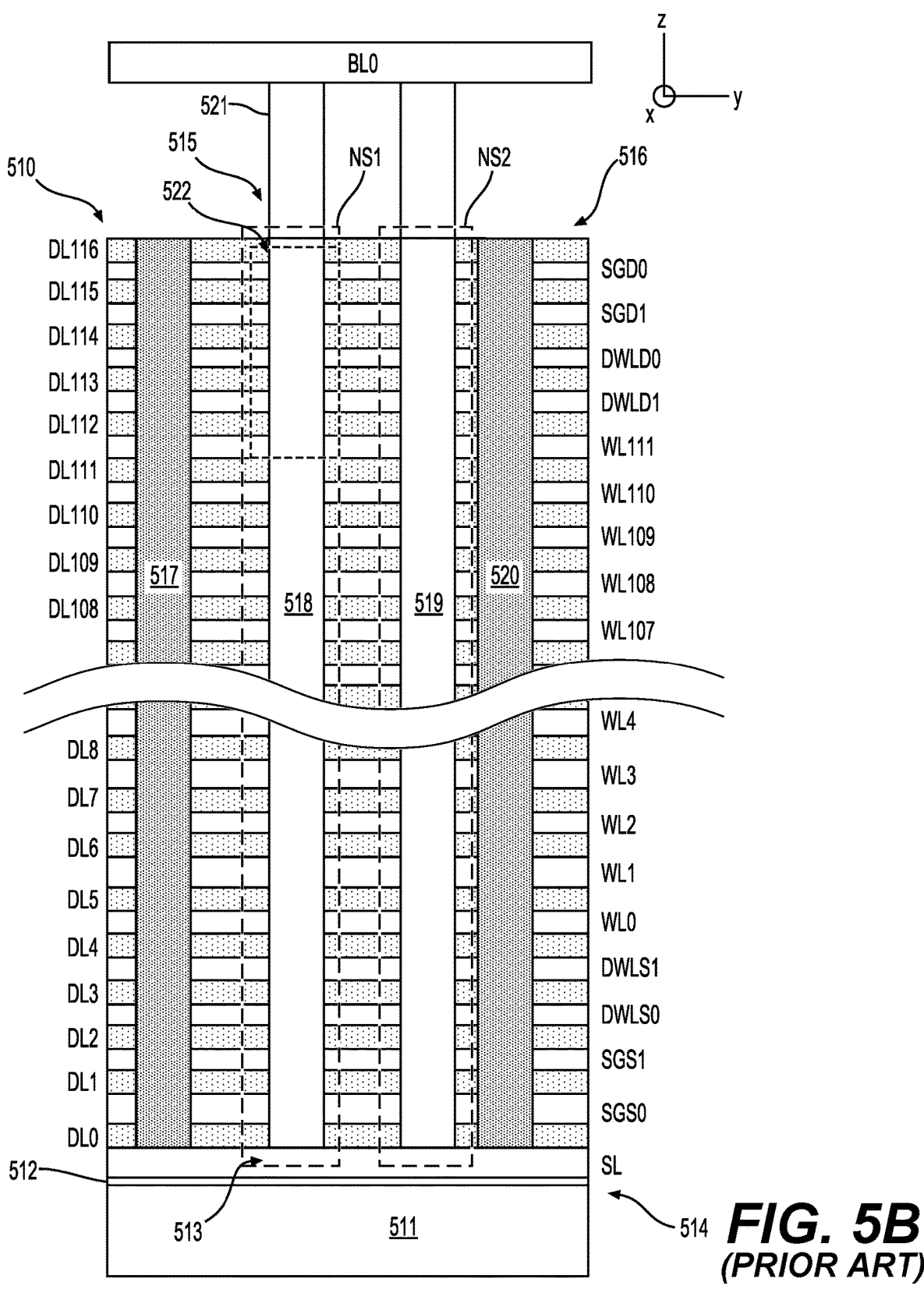
FIG. 5B depicts an example cross-sectional view of a portion of one of the blocks of FIG. 5A.

FIG. 5B illustrates an example cross-sectional view of a portion of one of the blocks BLK0, BLK1, BLK2, BLK3 of FIG. 5A. The block comprises a stack 510 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 510 which comprise NAND strings NS1 and NS2 are illustrated. Each NAND string encompasses a memory hole 518, 519 which is filled with materials which form memory cells adjacent to the word lines. A region 522 of the stack 510 is shown in greater detail in FIG. 5D and is discussed in further detail below.

The stack 510 includes a substrate 511, an insulating film 512 on the substrate 511, and a portion of a source line SL. NS1 has a source-end 513 at a bottom 514 of the stack and a drain-end 515 at a top 516 of the stack 510. Contact line connectors (e.g., slits, such as metal-filled slits) 517, 520 may be provided periodically across the stack 510 as interconnects which extend through the stack 510, such as to connect the source line to a particular contact line above the stack 510. The contact line connectors 517, 520 may be used during the formation of the word lines and subsequently filled with metal. A portion of a bit line BL0 is also illustrated. A conductive via 521 connects the drain-end 515 to BL0.

Figure 5C:
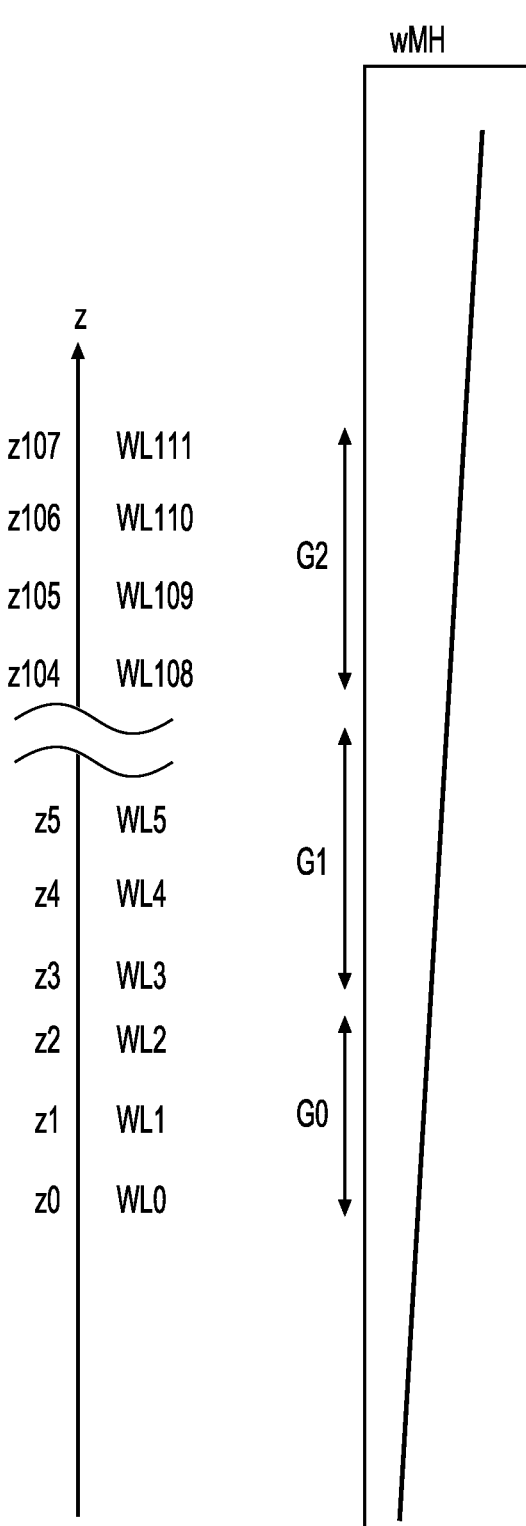
FIG. 5C depicts a plot of memory hole diameter of the stack of FIG. 5B.

FIG. 5C illustrates a plot of memory hole diameter in the stack of FIG. 5B. The vertical axis is aligned with the stack of FIG. 5B and illustrates a width (wMH), e.g., diameter, of the memory holes 518 and 519. The word line layers WL0-WL111 of FIG. 5A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 5D:
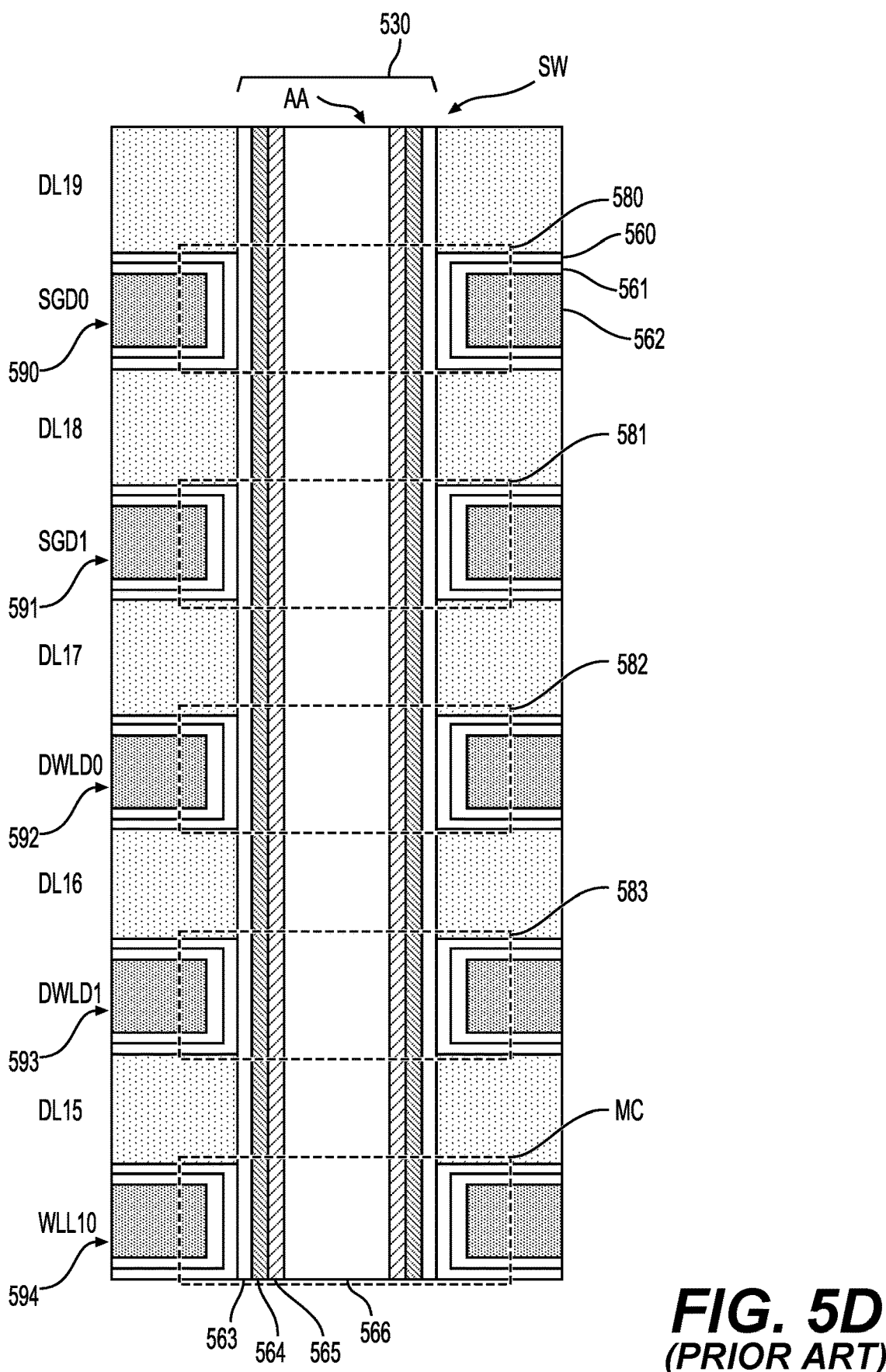
FIG. 5D depicts a close-up view of region 522 of the stack of FIG. 5B.

FIG. 5D illustrates a close-up view of the region 522 of the stack 510 of FIG. 5B. Memory cells are formed at the different levels of the stack at the intersection of a word line layer and a memory hole. In this example, SGD transistors 580, 581 are provided above dummy memory cells 582, 583 and a data memory cell MC. A number of layers can be deposited along the sidewall (SW) of the memory hole 530 and/or within each word line layer, e.g., using atomic layer deposition. For example, each column (e.g., the pillar which is formed by the materials within a memory hole 530) can include a charge-trapping layer or film 563 such as SiN or other nitride, a tunneling layer 564, a polysilicon body or channel 565, and a dielectric core 566. A word line layer can include a blocking oxide/block high-k material 560, a metal barrier 561, and a conductive metal 562 such as Tungsten as a control gate. For example, control gates 590, 591, 592, 593, and 594 are provided. In this example, all of the layers except the metal are provided in the memory hole 530. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the electrons return to the channel.

Each of the memory holes 530 can be filled with a plurality of annular layers comprising a blocking oxide layer, a charge trapping layer 563, a tunneling layer 564 and a channel layer. A core region of each of the memory holes 530 is filled with a body material, and the plurality of annular layers are between the core region and the word line in each of the memory holes 530.

The NAND string can be considered to have a floating body channel because the length of the channel is not formed on a substrate. Further, the NAND string is provided by a plurality of word line layers above one another in a stack, and separated from one another by dielectric layers.

Figures 6A, 6B:
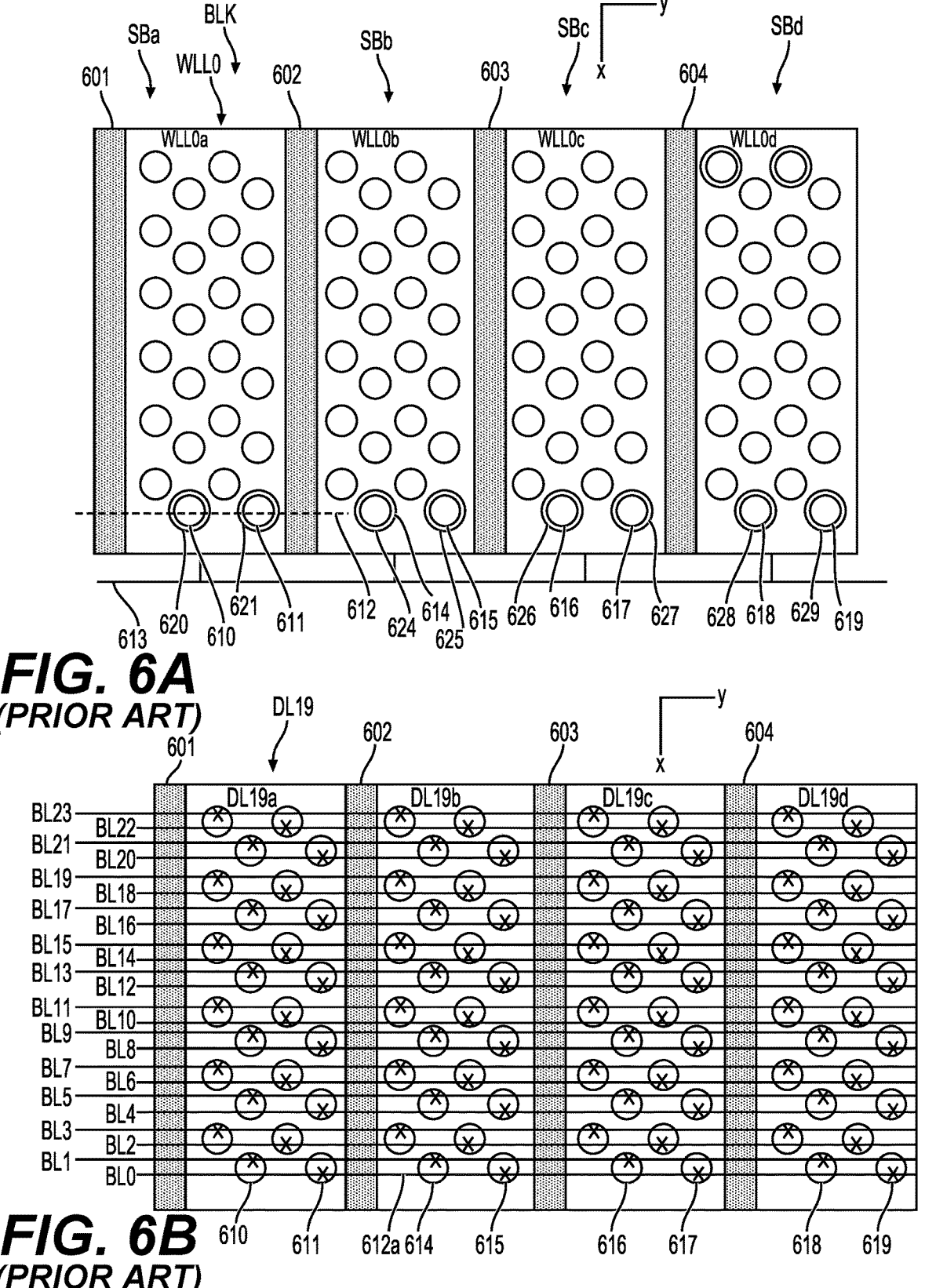
FIG. 6A depicts a top view of an example word line layer WL0 of the stack of FIG. 5B.
FIG. 6B depicts a top view of an example top dielectric layer DL116 of the stack of FIG. 5B.

FIG. 6A illustrates a top view of an example word line layer WL0 of the stack 510 of FIG. 5B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 613. The last region of a word line layer in a block can be connected to a first region of a word line layer in a next block, in one approach. The contact line 613, in turn, is connected to a voltage driver for the word line layer. The region WL0a has example memory holes 610, 611 along a contact line 612. The region WL0b has example memory holes 614, 615. The region WL0c has example memory holes 616, 617. The region WL0d has example memory holes 618, 619. The memory holes are also shown in FIG. 6B. Each memory hole can be part of a respective NAND string. For example, the memory holes 610, 614, 616 and 618 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 620, 621 are in WL0a, memory cells 624, 625 are in WL0b, memory cells 626, 627 are in WL0c, and memory cells 628, 629 are in WL0d. These memory cells are at a common height in the stack.

Contact line connectors (e.g., slits, such as metal-filled slits) 601, 602, 603, 604 may be located between and adjacent to the edges of the regions WL0a-WL0d. The contact line connectors 601, 602, 603, 604 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 6B illustrates a top view of an example top dielectric layer DL116 of the stack of FIG. 5B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 610, 611 along a contact line 612, which is coincident with a bit line BL0. A number of bit lines extend above the memory holes and are connected to the memory holes as indicated by the "X" symbols. BL0 is connected to a set of memory holes which includes the memory holes 611, 615, 617, 619. Another example bit line BL1 is connected to a set of memory holes which includes the memory holes 610, 614, 616, 618. The contact line connectors (e.g., slits, such as metal-filled slits) 601, 602, 603, 604 from FIG. 6A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to retain one or more bits of data in multiple data states, each of which is associated with a respective threshold voltage Vt range. For example, FIG. 7 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 8 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 9 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states. Generally, programming a fixed amount of data into memory cells at a higher number of bits per memory cell (such as TLC or QLC) requires more time than programming the same amount of data into more memory cells at a reduced number of bits per cell. In other words, there is a tradeoff between programming high speed (performance) and programming at high density. Also, programming to TLC or QLC stresses the memory cells more than programming to SLC, and therefore, the endurance (as measured in terabytes written [TBW]) of a memory device programming to SLC is generally greater than the endurance of a memory device programming to TLC or QLC.

Figures 10A, 10B:
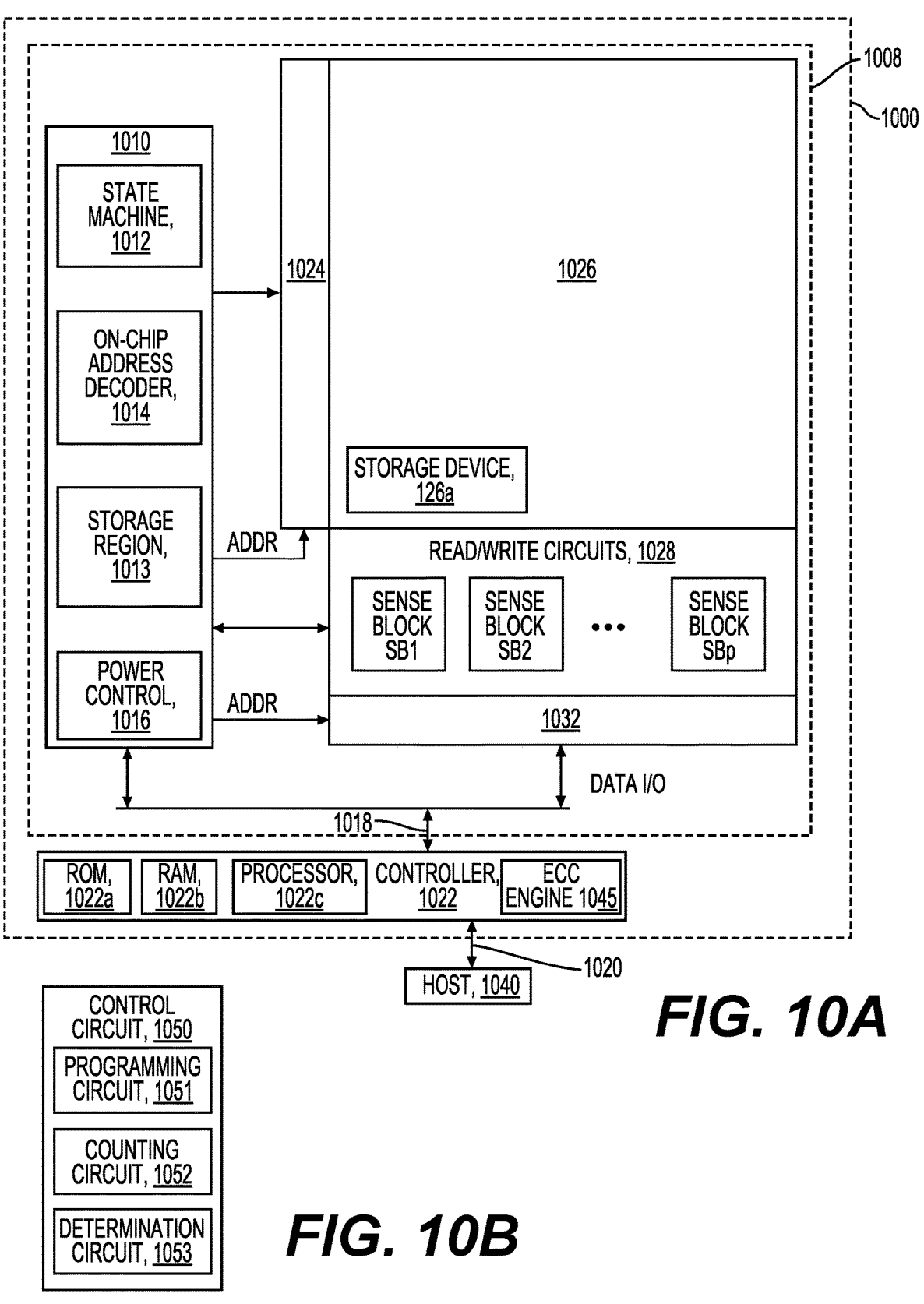
FIG. 10A is a block diagram of an example memory device configured to implement neighbor plane disturb (NPD) techniques according to the principles of the present disclosure.
FIG. 10B is a block diagram of an example control circuit implemented by the memory device of FIG. 10A.

FIG. 10A is a block diagram of an example memory device 1000 that is configured to operate according to NPD detection techniques of the present disclosure. The memory die 1008 includes a memory structure 1026 of memory cells arranged in word lines, such as an array of memory cells, control circuitry 1010, and read/write circuits 1028. The memory structure 1026 is addressable by word lines via a row decoder 1024 and by bit lines via a column decoder 1032. The read/write circuits 1028 include multiple sense blocks SB1, SB2, . . . SBp (sensing circuitry) and allow a page of memory cells to be read or programmed in parallel. A controller 1022 may be included in the same memory device 1000 (e.g., a removable storage card) as the one or more memory die 1008. Commands and data are transferred between the host 1040 and controller 1022 via a data bus 1020, and between the controller and the one or more memory die 1008 via lines 1018. In some examples, the controller 1022 is configured to perform all or portions of the NPD detection techniques during a multi-plane programming (i.e., write) operation of the present disclosure. Control circuitry 1010 may also be configured to perform all or portions of the NPD detection techniques during a multi-plane programming operation of the present disclosure.

The memory structure 1026 can be two-dimensional or three-dimensional. The memory structure 1026 may comprise one or more array of memory cells including a three-dimensional array. The memory structure 1026 may comprise a monolithic three-dimensional memory structure in which multiple memory levels are formed above (and not in) a single substrate, such as a wafer, with no intervening substrates. The memory structure 1026 may comprise any type of non-volatile memory that is monolithically formed in one or more physical levels of arrays of memory cells having an active area disposed above a silicon substrate. The memory structure 1026 may be in a non-volatile memory device having circuitry associated with the operation of the memory cells, whether the associated circuitry is above or within the substrate.

The control circuitry 1010 cooperates with the read/write circuits 1028 to perform memory operations on the memory structure 1026, and includes a state machine 1012, an on-chip address decoder 1014, and a power control module 1016. The state machine 1012 provides chip-level control of memory operations. As discussed in further detail below, the control circuitry 1010 is configured to operate the memory device 1000 according to the NPD detection techniques of the present disclosure.

Turning back to FIG. 10A, a storage region 1013 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 1014 provides an address interface that is used by the host or a memory controller to determine the hardware address used by the decoders 1024 and 1032. The power control module 1016 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 1026, can be thought of as at least one control circuit which is configured to perform the actions described herein. For example, a control circuit may include any one of, or a combination of, control circuitry 1010, state machine 1012, decoders 1014/1032, power control module 1016, sense blocks SBb, SB2, . . . , SBp, read/write circuits 1028, controller 1022, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, whether a programming operation is completed. For example, FIG. 10B is a block diagram of an example control circuit 1050 which comprises a programming circuit 1051, a counting circuit 1052, and a determination circuit 1053. The control circuit 1050 may be configured to perform all or portions of the NPD detection techniques during a multi-plane programming operation of the present disclosure.

The controller 1022 may comprise a processor 1022c, storage devices (memory) such as ROM 1022a and RAM 1022b and an error-correction code (ECC) engine 1045. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 1022a, 1022b comprise, code such as a set of instructions, and the processor 1022c is operable to execute the set of instructions to provide the functionality described herein. Alternately or additionally, the processor 1022c can access code from a storage device 1026a of the memory structure 1026, such as a reserved area of memory cells in one or more word lines. For example, code can be used by the controller 1022 to access the memory structure 1026 such as for programming, read, and erase operations. The code can include boot code and control code (e.g., set of instructions). The boot code is software that initializes the controller 1022 during a booting or startup process and enables the controller 1022 to access the memory structure 1026. The code can be used by the controller 1022 to control one or more memory structures 1026. Upon being powered up, the processor 1022c fetches the boot code from the ROM 1022a or storage device 1026a for execution, and the boot code initializes the system components and loads the control code into the RAM 1022b. Once the control code is loaded into the RAM 1022b, it is executed by the processor 1022c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

In other examples, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

The memory cells of a memory block are typically programmed by applying a voltage differential between a word line of a memory cell and a bit line coupled to the same memory cell, thereby causing electrons to tunnel into the floating gate of that memory cell and causing a threshold voltage of the memory cell to increase. Programming typically occurs sequentially from one word line to another across a memory block or sub-block. In other words, programming occurs with one word line at a time.

Figure 11:
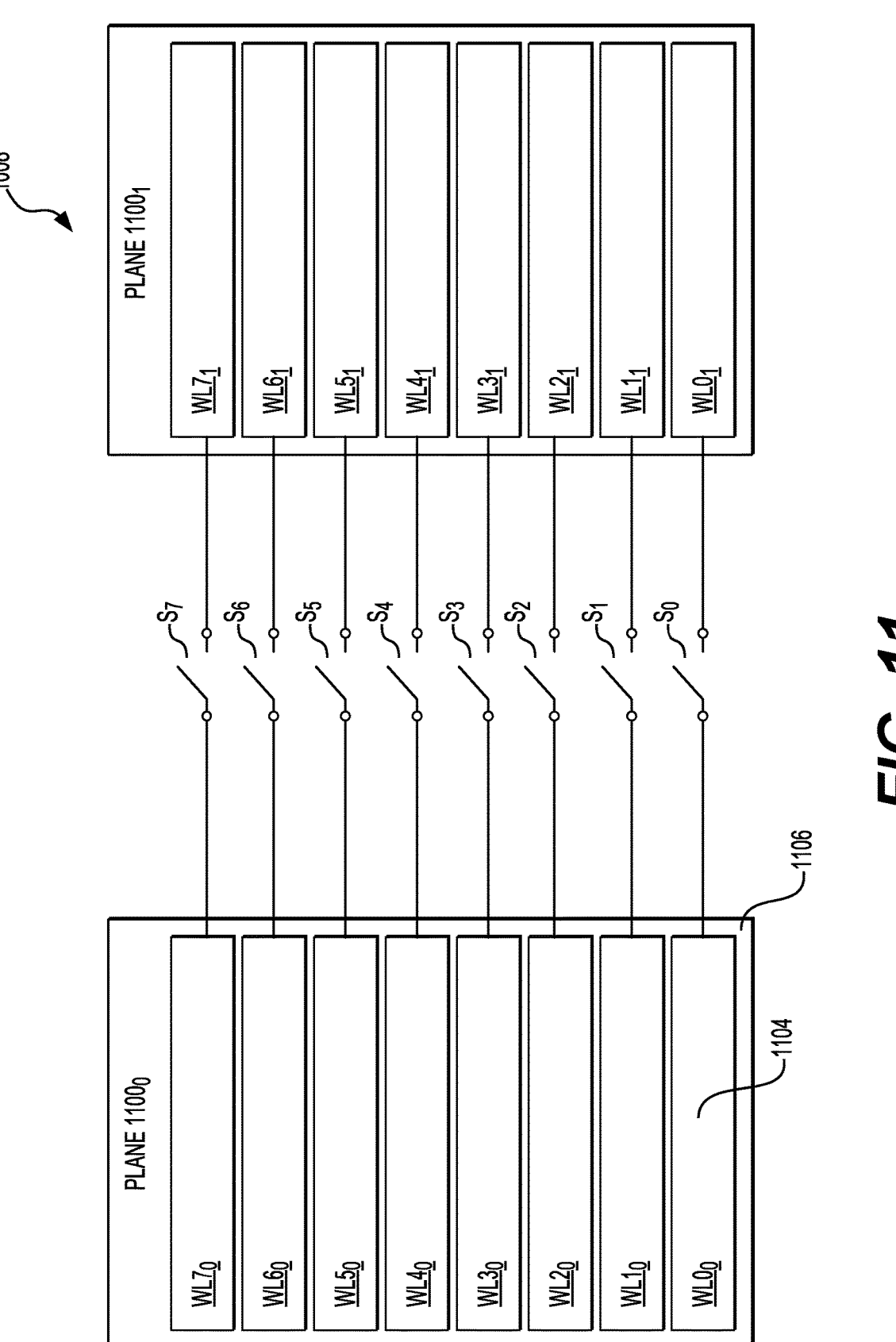
FIG. 11 a block diagram of an example simplified multi-plane organization of a memory structure.

In multi-plane programming, a memory structure is divided into multiple planes and memory cells in multiple plans connected to same word lines may be programmed concurrently. FIG. 11 is a block diagram depicting a simplified multi-plane organization of a memory structure divided into a first plane $1100_0$ and a second plane $1100_1$ located on a same memory die (e.g., die 1008 of FIG. 10A). The first plane $1100_0$ includes eight word lines WL0 0, WL1 0, WL2 0, . . . , WL7 0 and the second plane $1100_1$ includes eight word lines WL0 1, WL1 1, WL2 1, . . . , WL7 1. In other embodiments, first plane $1100_0$ and the second plane $1100_1$ each may include more or fewer than eight word lines.

Switches S0, S1, . . . , S7 may be used to selectively couple word lines WL0 0, WL1 0, . . . , WL7 0 on the first plane $1100_0$ to corresponding word line WL0 1, WL2 1, . . . , WL7 1 on the second plane $1100_1$. In multi-plane programming, switch S0 closes to couple word lines WL0 0 and WL0 1, switch S1 closes to couple word lines WL1 0 and WL1 1, switch S2 closes to selectively couple word lines WL2 0 and WL2 1, and so on.

In the illustrated example, as a result of a manufacturing defect, a first word line-to-word line short 1104 exists between word line WL0 0 and word line WL1 0, and a second word line-to-word line short 1106 exists between word line WL1 0 and word line WL2 0. In this example, the manufacturing defects are only on word lines in the first plane $1100_0$. No word line-to-word line shorts exist on the second plane $1100_1$. In other instances, manufacturing defects may exist only in the second plane $1100_1$, or in both the first plane $1100_0$ and the second plane $1100_1$.

During programming, one or more programming pulses are applied to word lines WL0 0 and WL0 1, one or more programming pulses are applied to word lines WL1 0 and WL1 1, one or more programming pulses are applied to word lines WL2 0 and WL2 1, and so on. As a result of first word line-to word line short 1104 and second word line-to word line short 1106, programming of memory cells coupled to word line WL0 0 fails because the voltage of word line WL0 0 is pulled down by shorted word lines WL1 0 and WL2 0.

In particular, word line WL0 0 is unable to reach a high enough voltage level to successfully program memory cells coupled to word line WL0 0 before a maximum number of program loops is reached. First word line-to word line short 1104 and second word line-to word line short 1106 cause the same failure to occur while attempting to program memory cells coupled to word lines WL1 0 and WL2 0.

Although no word line-to-word line shorts exist in the second plane $1100_1$, switches S0, S1, . . . , S7 couple corresponding word lines on the first plane $1100_0$ and the second plane $1100_1$. Accordingly, because the voltage of WL0 0 is pulled down by shorted word lines WL1 0 and WL2 0, coupled word line WL0 1 also is unable to reach a high enough voltage level to successfully program memory cells coupled to word line WL0 1 before the maximum number of program loops is reached. Likewise, the same failure occurs while attempting to program memory cells coupled to word lines WL1 1 and WL2 1.

This phenomenon is sometimes referred to as "neighbor plane disturb," or "NPD." In such a scenario, the first plane $1100_0$ is sometimes referred to as the "attacker block," and the second plane $1100_1$ is sometimes referred to as the "victim block" because word line defects on the first plane $1100_0$ disturb programming of coupled word lines of the second plane $1100_1$.

NPD causes higher defective parts per million (DPPM) because NPD generally leads to victim block UECC (uncorrectable by error correction code) failure, and results in data loss, which is difficult to overcome. One approach to address NPD focuses on reducing defect density from process. Another approach implements an early program termination (EPT) mode. For EPT, a programming operation may be terminated early to minimize the amount of charge that leaks to neighboring planes. For example, if programming loops are limited, programming of a shorted or slow plane will be terminated earlier, resulting in less disturb on neighboring planes.

However, EPT still requires a certain number of programming loops be completed (e.g., the maximum number of program loops) prior to determining whether an NPD defect is present. In other words, determination of the multi-plane programming operation may be detected only after the programming operation is completed, which results in significant programming delays. Further, since the entire multi-plane programming operation is determined to have failed, it is not possible to detect which plane caused the failure. NPD detection techniques according to the present disclosure are configured to detect NPD during, and prior to completing, the multi-plane programming operation and identify the plane in which NPD was detected as described below in more detail.

For example, implementation of the NPD detection techniques by the controller 1022 and/or other control circuitry may include selecting and operating in accordance with an NPD detection mode during the multi-plane programming operation. The NPD detection mode may be selectively enabled and disabled (i.e., operating in the NPD detection mode may be optional). Detecting NPD during the multi-plane programming operation causes the controller 1022 to terminate the programming operation (i.e., prior to the maximum number of programming loops being performed and without applying the program voltage (VPGM) for the maximum number of programming loops) and to identify which plane caused the NPD defect, resulting in faster NPD detection and improved system performance for subsequent programming operations.

In some examples, the controller 1022 performs the NPD detection using a design for testability (DFT) circuit or circuitry. For example, some memory devices already include DFT circuitry to facilitate testing of functionality of the memory devices (e.g., to check for defective pumps or other components). The controller 1022 according to the present disclosure is configured to, using DFT circuitry or other detection circuitry, detect the program voltage during the multi-plane programming operation and detect and identify NPD based on the program voltage as described below in more detail. For example only, the controller memory device 1000 as depicted in FIG. 10A is shown to include detection circuity 1060 (which may correspond to a DFT circuit). Although shown external to the controller 1022, in other examples all or portions of the detection circuitry 1060 may be implemented within the controller 1022, the control circuitry 1010, the control circuit 1050, and/or other portions of the memory device 1000.

Figures 12A, 12B:
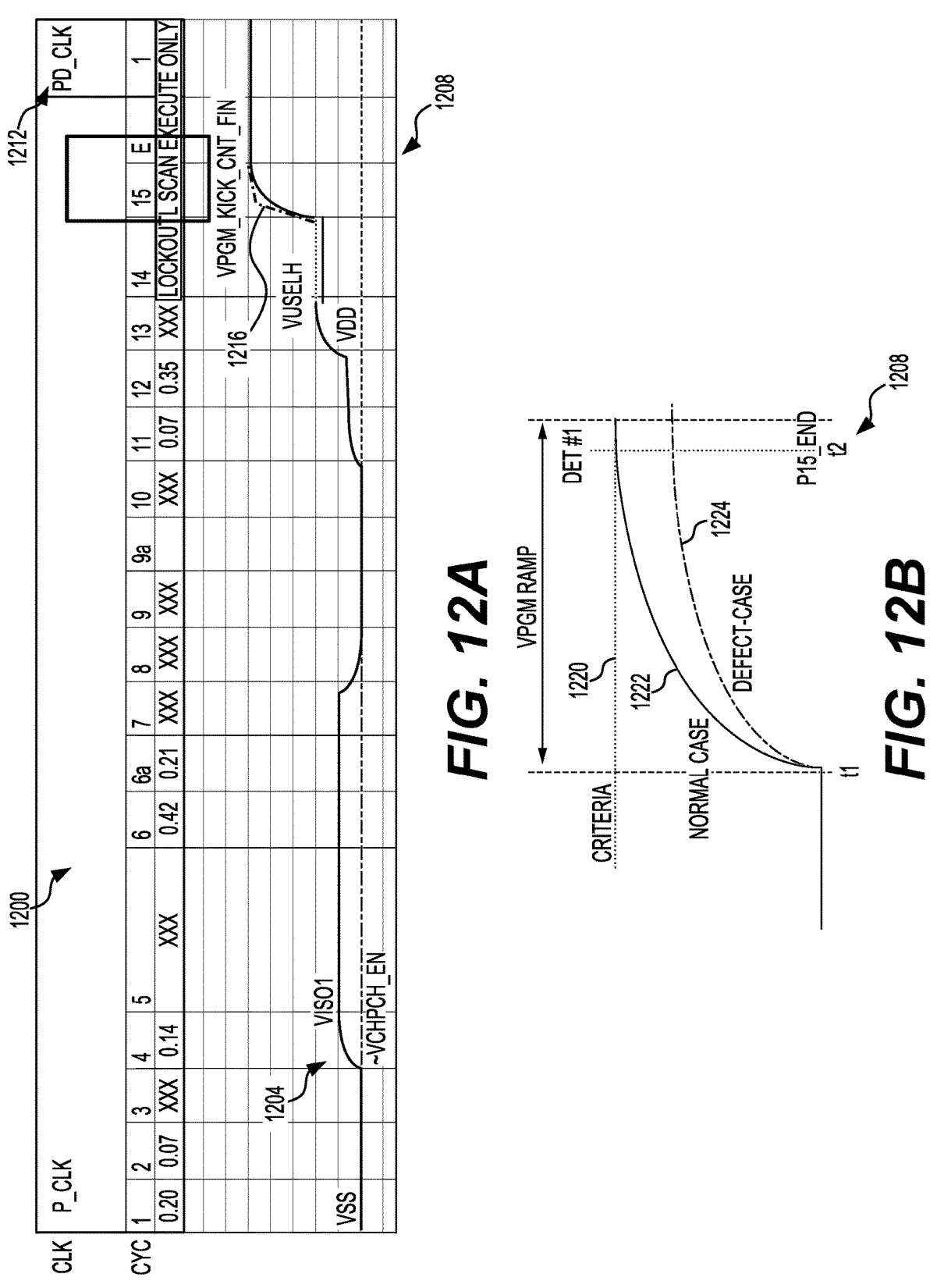
FIGS. 12A and 12B illustrate an example neighbor plane disturb (NPD) detection technique according to the present disclosure.

The NPD detection techniques according to the present disclosure as implemented by the controller 1022 are described in more detail with respect to FIGS. 12A and 12B. In a programming clock (P_CLK) period 1200 during a typical programming operation, various voltages are applied to different components of a memory device in respective cycles or sequences of cycles, including voltages applied to a selected word line as indicated at 1204. For a multi-plane programming operation (i.e., operation in a multi-plane programming mode), the selected word line may correspond to a word line coupled to memory cells in two or more planes as described above. The controller 1022 may be configured to operate in (e.g., select between) the multi-plane programming mode and a single plane programming mode (i.e., a programming mode in which programming is sequentially performed plane-by-plane).

The program voltage (e.g., VPGM) applied to the selected word line (e.g., in one or more cycles 1208 at an end of the programming clock period 1200 and prior to a subsequent clock period 1212) ramps upward as shown at 1216. For normal operation (i.e., a multi-plane programming operation where no NPD defects are present), the program voltage may be expected to reach a target voltage level by the end of the programming clock period 1200. Conversely, in accordance with the principles of the present disclosure, a NPD defect being present in one of the planes being programmed in a multi-plane programming operation may decrease a ramp rate of the program voltage, resulting in the program voltage not reaching the target voltage level by the end of the programming clock period 1200.

For example, as shown in more detail in FIG. 12B, the program voltage is applied to the selected word line at a time t1 and begins to ramp upward toward a target voltage level 1220. The target voltage level 1220 may be predetermined, set during manufacturing, adjusted, etc. For normal operation (i.e., when no NPD defects are present), the program voltage may be expected to reach the target voltage level 1220 prior to an end of the programming clock period 1200 (e.g., by a time t2) as shown by program voltage waveform 1222. Accordingly, in response to the program voltage reaching the target voltage level 1220 (e.g., in each programming loop, as measured/sensed by the detection circuitry 1060) by the time t2 of the programming clock period 1200, the controller 1022 determines that the program voltage reached the target voltage level 1220 for a current programming loop. For example, the controller 1022 may set/store a flag or bit indicating that the program voltage reached the target voltage level 1220 for the current programming loop.

Conversely, when an NPD defect is present in a plane being programmed in the multi-plane programming operation, the program voltage may not reach the target voltage level 1220 prior to the end of the programming clock period 1200 as shown by program voltage waveform 1224. Accordingly, the controller 1022 may set/store a flag or bit indicating that the program voltage did not reach the target voltage level 1220, thereby indicating that the current programming loop failed.

In response to a failure detected during a programming loop (i.e., the program voltage not reaching the target voltage level 1220 during a given programming loop of the multi-plane programming operation), the multi-plane programming operation is terminated upon completion of the voltage ramp operation (e.g., upon completion of P_CLK) of the current programming loop (i.e., the programming loop during which the failure was detected). In other words, in contrast to the EPT techniques described above, the multi-plane programming operation according to the present disclosure does not continue until the maximum number of programming loops are competed. Instead, the multi-plane programming operation is terminated upon completion of the failed programming loop.

Upon termination of the multi-plane programming operation, the controller 1022 selects the single plane programming mode and performs the NPD detection techniques described above during a single plane programming operation. For example, the controller 1022 performs the single plane programming operation on each plane (e.g., sequentially, plane-by-plane) corresponding to the failed multi-plane programming operation, which may be referred to as an NPD diagnosis mode.

During the programming of each individual plane, the program voltage is applied as described above. In response to the program voltage reaching the target voltage level 1220 in each programming loop for the current plane, the controller 1022 determines that the current plane does not include NPD defects and was not the cause of the failure of the multi-plane programming operation. Conversely, in response to the program voltage not reaching the target level 1220, the controller 1022 determines that the current plane includes an NPD defect. For a failed multi-plane programming operation, one or more planes having an NPD defect may be detected during the NPD diagnosis mode. In this manner, each plane having an NPD defect can be identified and marked (e.g., with a flag or status bit indicating that a respective plane/block is bad or defective and should not be used). For example, in response to an NPD defect being detected for a given word line, a block corresponding to that word line may be marked as failed (e.g., with a pass/fail status bit) and can be omitted from subsequent programming operations. Accordingly, multi-plane programming may still be used. In other words, since the failed block will not be programmed during subsequent multi-plane programming operations, the failed block will not cause a failure (i.e., due to NPD defects) during the subsequent multi-plane programming operations.

Figure 13:
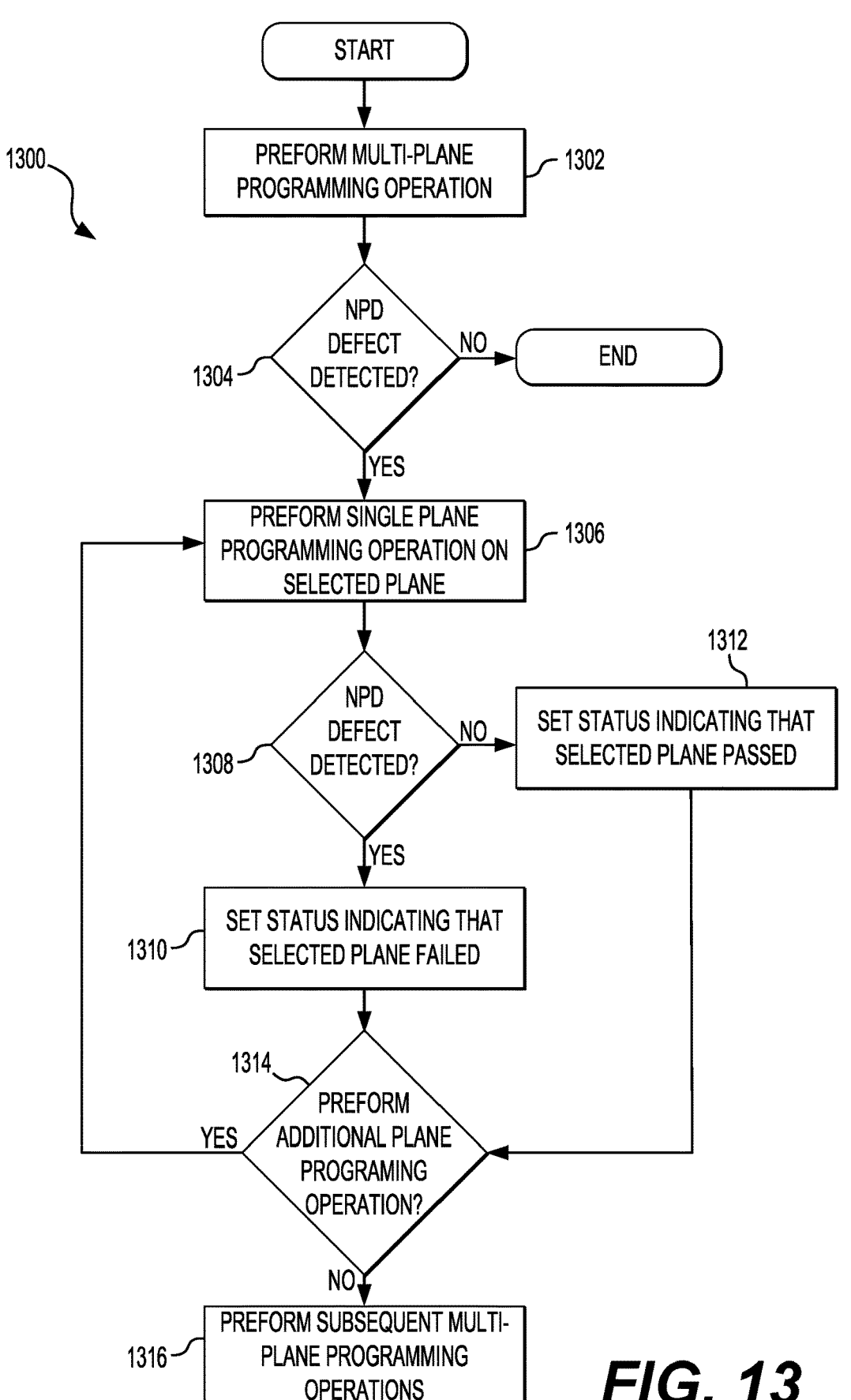
FIG. 13 illustrates steps of an example NPD detection method according to the present disclosure.

FIG. 13 illustrates steps of an example method 1300 for detecting NPD according to the present disclosure. At 1302, the method 1300 (e.g., the controller 1022) performs a multi-plane programming operation as described above (e.g., to program a plurality of blocks in respective planes of a multi-plane structure). In accordance with the principles of the present disclosure, the method 1300 terminates the multi-plane programming operation in response to an NPD defect being detected in any programming loop without completing the maximum number of programming loops. For example, at 1304, the method 1300 determines whether an NPD defect is detected during the multi-plane programming operation (e.g., by sensing/detecting the program voltage and determining whether the program voltage reaches the target voltage level by the end of the programming clock period as described above). If true, the method 1300 continues to 1306. If false, the method 1300 ends (e.g., the controller 1022 continues with "normal" multi-plane programming operation). For example, if no NPD defect is detected during any programming loop, the multi-plane programming operation is determined to have passed. Conversely, in response to an NPD defect being detected, the multi-plane programming operation is terminated upon completion of a current programming loop.

At 1306, the method 1300 (e.g., the controller 1022) initiates an NPD diagnosis mode and performs a single plane (i.e., sequential, plane-by-plane) programming operation (e.g., on a selected plane). At 1308, the method 1300 (e.g., the controller 1022) determines whether an NPD defect is detected during the single plane programming operation as described above. If true, the method 1300 continues to 1310. If false, the method continues to 1312. At 1310, the method 1300 determines that the selected plane has an NPD defect (e.g., and sets a flag or status bit indicating that the selected plane failed). At 1312, the method 1300 determines that the selected plane passed and does not have an NPD defect (e.g., and sets a flag or status bit indicating that the selected plane passed).

At 1314, the method 1300 (e.g., the controller 1022) determines whether to perform an additional single plane programming operation (i.e., diagnose another plane corresponding to the failed multi-plane programming operation). If true, the method 1300 selects a next plane and continues to 1306. If false, the method 1300 continues to 1316.

At 1316, the method 1300 continues with normal operation and performs multi-plane programming operations. For example, in subsequent multi-plane programming operations, any block in a plane that was identified as having an NPD defect (as indicated by the status bit setting) is omitted/skipped as described above. In other words, the controller 1022 may continue operating in a multi-plane programming mode while simply not programming any planes having a block identified having an NPD defect. In other words, if memory cells in one or more planes of a block have an NPD defect, then the portions of those blocks in the one or more planes will not be programmed when performing a multi-plane programming operation that targets that block. However, memory cells in other planes of that block can still be programmed in a multi-plane programming operation.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
a plurality of memory cells arranged in a plurality of planes; and
control circuitry configured to perform a multi-plane programming operation in which memory cells in each of the plurality of planes are programmed in a single programming operation, wherein, to perform the multi-plane programming operation, the control circuitry is configured to
detect a neighbor plane disturb (NPD) defect during the multi-plane programming operation based on a program voltage applied to a word line of the memory device,
in response to detecting the NPD defect, terminate the multi-plane programming operation prior to completing the multi-plane programming operation, and
identify which plane of the plurality of planes includes the NPD defect.

2. The memory device of claim 1, wherein the control circuitry is configured to detect the NPD defect based on a determination of whether the program voltage reaches a target voltage level within a predetermined period.

3. The memory device of claim 1, wherein the word line corresponds to a word line coupled to the memory cells in each of the plurality of planes.

4. The memory device of claim 1, wherein, in response to detecting the NPD defect, the control circuitry is configured terminate the multi-plane programming operation prior to completing a maximum number of programming loops associated with the multi-plane programming operation.

5. The memory device of claim 1, wherein, to identify which plane of the plurality of planes includes the NPD defect, the control circuitry is configured to (i) transition from a multi-plane programming mode to a single plane programming mode and (ii) sequentially perform single plane programming operations on each of the plurality of planes.

6. The memory device of claim 5, wherein, during the single plane programming operations, the control circuitry is configured to identify whether a selected plane has the NPD defect based on a program voltage applied to a word line of the memory device.

7. A method for operating a memory device including a plurality of memory cells arranged in a plurality of planes, the method comprising:
performing a multi-plane programming operation in which memory cells in each of the plurality of planes are programmed in a single programming operation, wherein performing the multi-plane programming operation includes detecting a neighbor plane disturb (NPD) defect during the multi-plane programming operation based on a program voltage applied to a word line of the memory device,
in response to detecting the NPD defect, terminating the multi-plane programming operation prior to completing the multi-plane programming operation, and
identifying which plane of the plurality of planes includes the NPD defect.

8. The method of claim 7, further comprising detecting the NPD defect based on a determination of whether the program voltage reaches a target voltage level within a predetermined period.

9. The method of claim 7, wherein the word line corresponds to a word line coupled to the memory cells in each of the plurality of planes.

10. The method of claim 7, further comprising, in response to detecting the NPD defect, terminating the multi-plane programming operation prior to completing a maximum number of programming loops associated with the multi-plane programming operation.

11. The method of claim 7, wherein identifying which plane of the plurality of planes includes the NPD defect includes (i) transitioning from a multi-plane programming mode to a single plane programming mode and (ii) sequentially performing single plane programming operations on each of the plurality of planes.

12. The method of claim 11, further comprising, during the single plane programming operations, identifying whether a selected plane has the NPD defect based on a program voltage applied to a word line of the memory device.

13. A memory device, comprising:
a plurality of memory cells arranged in a plurality of planes; and
control means for performing a multi-plane programming operation in which memory cells in each of the plurality of planes are programmed in a single programming operation, wherein, to perform the multi-plane programming operation, the control means
detects a neighbor plane disturb (NPD) defect during the multi-plane programming operation based on whether a program voltage applied to a word line of the memory device reaches a target voltage level within a predetermined time,
in response to detecting the NPD defect, terminates the multi-plane programming operation prior to completing the multi-plane programming operation, and
identifies which plane of the plurality of planes includes the NPD defect.

14. The memory device of claim 13, wherein the word line corresponds to a word line coupled to the memory cells in each of the plurality of planes.

15. The memory device of claim 13, wherein, in response to detecting the NPD defect, the control means terminates the multi-plane programming operation prior to completing a maximum number of programming loops associated with the multi-plane programming operation.

16. The memory device of claim 13, wherein, to identify which plane of the plurality of planes includes the NPD defect, the control means (i) transitions from a multi-plane programming mode to a single plane programming mode and (ii) sequentially performs single plane programming operations on each of the plurality of planes.

17. The memory device of claim 16, wherein, during the single plane programming operations, the control means identifies whether a selected plane has the NPD defect based on a program voltage applied to a word line of the memory device.

\* \* \* \* \*